US006725110B2

(12) United States Patent
Suzuki

(10) Patent No.: US 6,725,110 B2
(45) Date of Patent: Apr. 20, 2004

(54) DIGITAL AUDIO DECODER

(75) Inventor: Toshihiko Suzuki, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 09/863,699

(22) Filed: May 23, 2001

(65) Prior Publication Data

US 2002/0111704 A1 Aug. 15, 2002

(30) Foreign Application Priority Data

May 26, 2000 (JP) ....................................... 2000-157306

(51) Int. Cl.[7] ........................... G06F 17/00; H04R 5/00; H03G 7/00; G10L 21/00

(52) U.S. Cl. ........................... 700/94; 381/22; 381/106; 704/500; 704/503

(58) Field of Search ........................... 700/94; 381/106, 381/17–22; 704/500–504, 200.1

(56) References Cited

U.S. PATENT DOCUMENTS

| | | | | | |
|---|---|---|---|---|---|
| 5,742,689 | A | * | 4/1998 | Tucker et al. | 381/17 |
| 5,864,816 | A | | 1/1999 | Everett | 704/500 |
| 5,867,819 | A | * | 2/1999 | Fukuchi et al. | 704/500 |
| 5,978,762 | A | * | 11/1999 | Smyth et al. | 704/200.1 |
| 6,016,473 | A | * | 1/2000 | Dolby | 704/500 |
| 6,104,996 | A | * | 8/2000 | Yin | 704/219 |
| 6,188,987 | B1 | * | 2/2001 | Fielder | 704/229 |
| 6,246,345 | B1 | * | 6/2001 | Davidson et al. | 341/51 |
| 6,301,558 | B1 | * | 10/2001 | Isozaki | 704/228 |

FOREIGN PATENT DOCUMENTS

| | | | |
|---|---|---|---|
| JP | 6149262 | 5/1994 | G10H/1/18 |
| JP | 08036399 | 2/1996 | |
| JP | 8036399 | 6/1996 | G10L/7/04 |
| JP | 09148940 | 6/1997 | |
| JP | 9148940 | 6/1997 | H03M/7/30 |
| JP | 2000029498 | 1/2000 | |

OTHER PUBLICATIONS

Merriam Webster's Collegiate Dictionary, 1999, Merriam–Webster, Tenth Edition, p. 765.*

Allen Gersho and Robert M. Gray, Vector Quantization and Signal Compression, 1992, Kluwer Academic Publishers, p. 137.*

* cited by examiner

*Primary Examiner*—Forester W. Isen
*Assistant Examiner*—Elizabeth McChesney
(74) *Attorney, Agent, or Firm*—Pillsbury Winthrop LLP

(57) ABSTRACT

A digital audio decoder decodes or expands compressed data such as bit stream data, which are compressed based on the MPEG/Audio standard. Inverse quantization circuits perform inverse quantization on plural bit stream data, which are supplied thereto in connection with multiple channels respectively, thus producing inversely quantized data with respect to a prescribed number (e.g., thirty two) of sub-band samples respectively. The inversely quantized data are combined together among the multiple channels with respect to the prescribed number of the sub-band samples respectively. Then, a filter bank synthesizes together combined data corresponding to all of the sub-band samples, thus reproducing original digital audio signals. Multipliers are provided for use in gain control on the inversely quantized data with respect to the sub-band samples respectively. In addition, it is possible to additionally provide multipliers for amplifying the inversely quantized data of selected sub-band samples corresponding to low-frequency components of sound. This enables bass boost operations to be performed within the decoder. Surround effect processing circuits can be incorporated subsequently to the inverse quantization circuits, so desired surround effects are imparted to the inversely quantized data with respect to the sub-band samples respectively. The surround effect processing circuits simply contain multipliers whose coefficients are adequately controlled to achieve selective application of the surround effects among multiple channels.

10 Claims, 7 Drawing Sheets

DIGITAL AUDIO DECODER

BACKGROUND OF THE INVENTION

1. Field of the Invention

This invention relates to digital audio decoders that decode digital audio signals (or bit stream data) which are compressed by sub-band coding methods such as MPEG/Audio signals, ATRAC signals and AC-3 signals (where 'MPEG' stands for 'Moving Picture Experts Group', and 'ATRAC' stands for 'Adaptive Transform Acoustic Coding').

2. Description of the Related Art

Conventionally, there are provided various types of compression methods for compressing digital audio signals, one of which is known as the MPEG/Audio standard. FIG. 5 shows an example of a data compression circuit based on the aforementioned standard. Input digital audio signals Da are partitioned into blocks (namely, frames), each of which contains a prescribed number of samples. In the data compression circuit shown in FIG. 4, the input digital audio signals Da are processed by two paths. A first path brings the digital audio signals Da to a filter bank 1 in which they are divided into sub-band signals of thirty-two bands that have equal bandwidths respectively. Each of the sub-band signals is down-sampled to 1/32 of the sampling frequency. Then, the sub-band signals are forwarded to a scale factor extraction normalization circuit 2, wherein a sample having a maximal absolute value is detected from each frame of the sub-band signals. The detected value is subjected to quantization to produce a specific value, which is called a scale factor. Using the scale factors, the sub-band signals are subjected to division process and are then subjected to normalization into a prescribed range of values within ±1.

A second path brings the digital audio signals Da to an auditory psychology analysis (or auditory perception analysis) block 3 in which frequency spectra are calculated by the fast Fourier transform (FFT). Based on the calculated frequency spectra, the auditory psychology analysis block 3 produces masking thresholds for the sub-band signals respectively, namely allowable quantization noise power. A bit allocation block 4 operates under the restriction of the output of the auditory psychology analysis block 3 and a prescribed number of bits that can be used in one frame, which is determined by the bit rate. Under the aforementioned restriction, the bit allocation block 4 performs repeated loop processes to determine numbers of quantized bits (hereinafter, referred to as 'quantization bit numbers') with respect to sub-bands respectively. Using the quantization bit numbers set for the sub-bands respectively, the quantization block 5 performs quantization on the sub-band signals output from the scale factor extraction normalization circuit 2. That is, the quantization block 5 produces 'quantized' sub-band samples. A bit stream generation block 6 combines the quantized sub-band samples, bit allocation information and scale factor for each of the sub-bands together in a multiplexing manner. In addition, a header is added to them to create a bit stream, which is output from the bit stream generation block 6.

FIG. 6 shows an example of a configuration of a decoder (or data expansion circuit) that decodes the bit stream, which is produced by the data compression circuit of FIG. 4. Herein, a bit allocation information and scale factor extraction block 11 extracts the bit allocation information and scale factor from the bit stream. In response to the bit allocation information, an inverse quantization circuit 12 reads bit strings respectively corresponding to thirty-two sub-band samples from the bit stream, wherein the bit strings are subjected to inverse quantization with respect to each of the sub-band samples and are then subjected to multiplication by the scale factors. Thus, the inverse quantization circuit 12 produces 'inversely quantized' sub-band signals, which are synthesized together to reproduce the original digital audio signals by a sub-band synthesis filter bank 13.

Recently, so-called digital sound sources based on the MPEG/Audio standard are widely used in a variety of fields such as pinball game machines, which are widely used in amusement places in Japan. FIG. 6 shows a configuration of a musical tone generation circuit that operates based on the MPEG/Audio standard. Herein, reference numerals 21 designate MPEG/Audio sound sources that contain memories for storing musical tone data, which are made in forms of bit streams respectively, and readout circuits for reading data from the memories respectively. Reference numerals 22 designate decoders (see FIG. 5) that expand output data of the MPEG/Audio sound sources to restore original PCM musical tone data (where 'PCM' stands for 'PulseCode Modulation'). Reference numerals 23 designate multipliers that perform gain controls on outputs of the decoders 22. Reference numeral 24 designates an adder that adds together outputs of the multipliers 23. The above describes an example of the configuration of the musical tone generation circuit that is applied to the pinball game machine, for example. This musical tone generation circuit normally provides plural sound sources for multiple channels. That is, the plural sound sources produce MPEG/Audio digital musical tone signals, which are synthesized together to form composite musical tone signals.

The decoder 22 shown in FIG. 6 has processes regarding inverse quantization and sub-band synthesis filter bank, wherein the sub-band synthesis filter bank 13 is configured by a RAM having a relatively large storage capacity. For this reason, the aforementioned musical tone generation circuit of the MPEG/Audio standard, which provides the decoders 22 subsequently to the sound sources 21, bears a problem because the total storage capacity should be increased so much.

It is well known that the conventional digital audio devices use so-called bass boost circuits that amplify low-frequency components of sound. The musical tone generation circuit of the MPEG/Audio standard additionally provides bass boost circuits subsequently to the decoders 22. However, such a configuration causes a problem due to complexity of circuitry because the bass boost circuits should be provided independently of the decoders 22.

In the fields of the digital audio techniques in these days, so-called surround effect techniques are frequently used to enhance richness of sounds. FIG. 8 shows an example of a sound effect circuit, which inputs left-channel signals Li and right-channel signals Ri. Herein, a subtracter 25 produces difference signals between the left-channel signals Li and right-channel signals Ri. A low-pass filter (LPF) filters low frequency components of the difference signals, which are applied to multipliers 26, 27 respectively. The multiplier 26 multiplies them by a positive multiplication coefficient 'a', while the multiplier 27 multiplies them by a negative multiplication coefficient '−a'. An adder 28 adds together the output of the multiplier 26 and the left-channel signals Li, while an adder 29 adds together the output of the multiplier 27 and the right-channel signals Ri. Thus, the surround effect circuit outputs surround-effect imparted left-channel signals Lo and surround-effect imparted right-channel signals Ro.

It is possible to realize surround effects on musical tone signals of multiple channels. In that case, the musical tone signals are mixed together over the multiple channels with respect to the left channel and right channel respectively. This provides uniform surround effects on all of the channels. However, this is disadvantageous in the prescribe case where one channel is given monaural signals while another channel (left or right channel) is given stereophonic signals because the aforementioned surround effect circuit mistakenly produces mixed signals of two channels as Lo and Ro in FIG. 8.

Conventionally, a variety of configurations and techniques are proposed for processing of digital audio data. For example, Japanese Patent Unexamined Publication No. Hei 8-36399 discloses a processing device in which gain control is made between inverse quantization and quantization of bit streams. Japanese Patent Unexamined Publication No. 2000-29498 discloses a mixing technique using quantization and data reconstruction on compressed digital audio signals of divided frequency bands. Japanese Patent Unexamined Publication No. Hei 9-148940 discloses an improvement in bass boost process on synthesis of compressed data of divided frequency bands. However, none of the aforementioned publications teaches an effective method for solving the aforementioned problems.

SUMMARY OF THE INVENTION

It is an object of the invention to provide a digital audio decoder that is reduced in total storage capacity and is simplified in circuit configuration on decoding of compressed digital audio data of divided frequency bands.

It is another object of the invention to provide a digital audio decoder that is capable of imparting desired surround effects on multiple channels independently.

A digital audio decoder of this invention is designed to decode or expand compressed data such as bit stream data, which are compressed based on the MPEG/Audio standard. Herein, inverse quantization circuits perform inverse quantization on plural bit stream data, which are supplied thereto in connection with multiple channels respectively, so that inversely quantized data are produced with respect to a prescribed number (e.g., thirty two) of sub-band samples respectively. The inversely quantized data are combined together among the multiple channels with respect to the prescribed number of the sub-band samples respectively. Then, a filter bank synthesizes together combined data corresponding to all of the sub-band samples, thus reproducing original digital audio signals. Because this invention needs only one filter bank having a relatively large storage capacity, it is possible to reduce the total storage capacity in the digital audio decoder, and it is possible to reduce complexity of circuit configurations in digital audio decoders in manufacture.

In the above, multipliers are provided for use in gain control on the inversely quantized data with respect to the sub-band samples respectively. In addition, it is possible to additionally provide multipliers for amplifying the inversely quantized data of selected sub-band samples corresponding to low-frequency components of sound. This enables bass boost operations to be performed within the decoder.

In addition, it is possible to provide surround effect processing circuits subsequently to the inverse quantization circuits, so desired surround effects are imparted to the inversely quantized data with respect to the sub-band samples respectively. The surround effect processing circuits simply contain multipliers whose coefficients are adequately controlled to achieve selective application of the surround effects among multiple channels.

BRIEF DESCRIPTION OF THE DRAWINGS

These and other objects, aspects and embodiments of the present invention will be described in more detail with reference to the following drawing figures, of which.

DESCRIPTION OF THE PREFERRED EMBODIMENTS

This invention will be described in further detail by way of examples with reference to the accompanying drawings.

Figure 1:
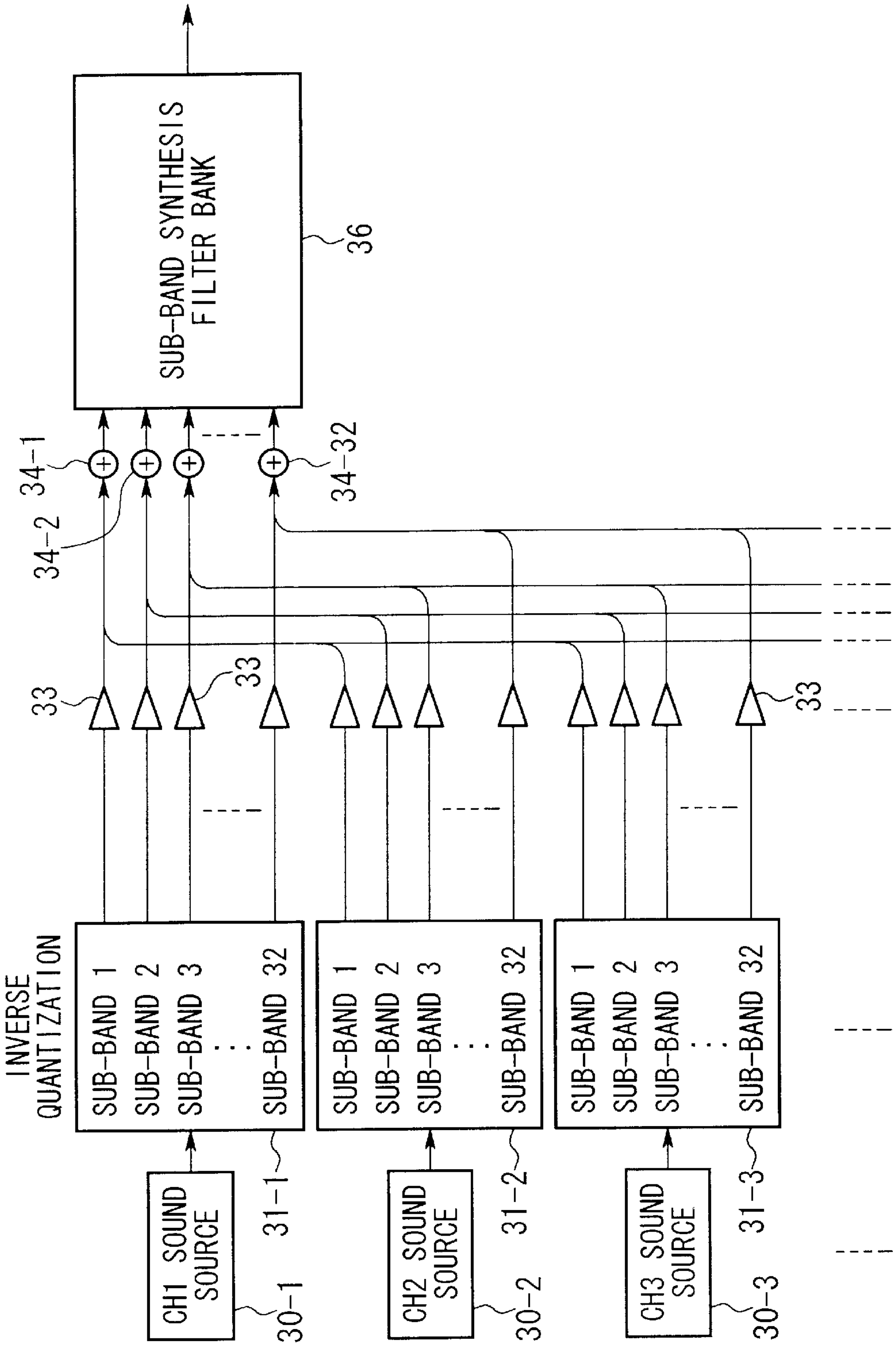
FIG. 1 is a block diagram showing a configuration of a digital audio decoder in accordance with a first embodiment of the invention.
Figure 6:
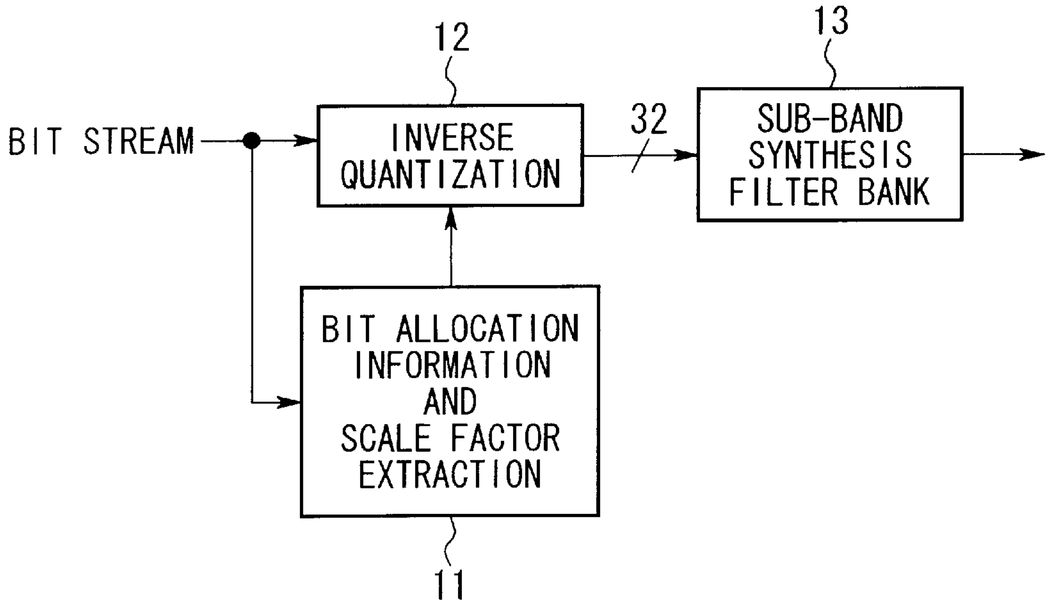
FIG. 6 is a block diagram showing an example of a data expansion circuit that operates based on the MPEG/Audio standard.
Figure 7:
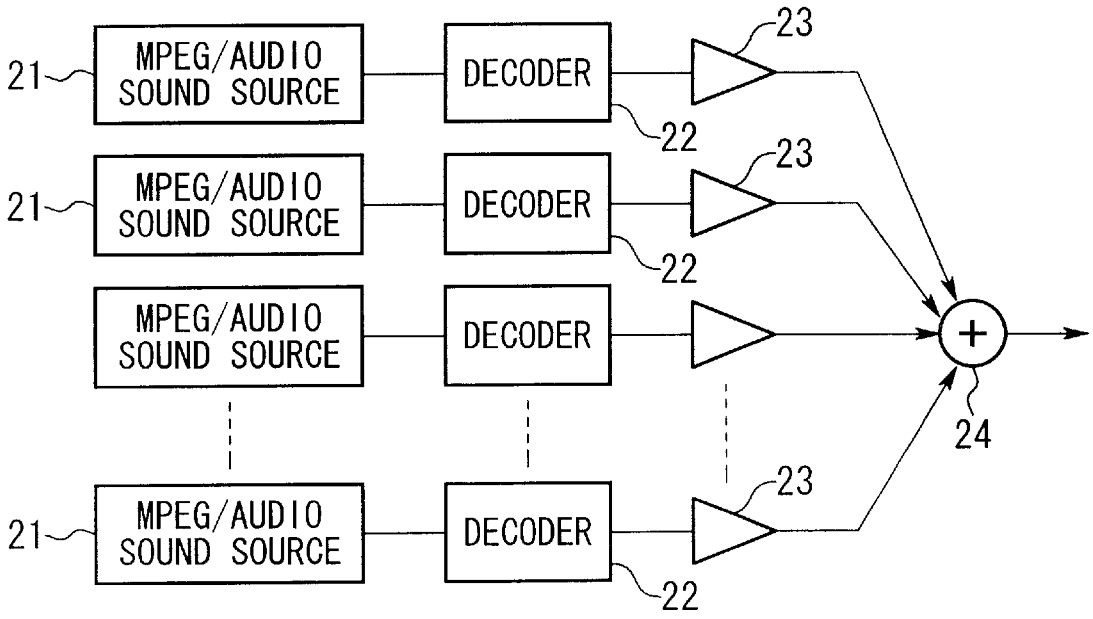
FIG. 7 is a block diagram showing an example of a data expansion circuit of multiple channels.

FIG. 1 shows a configuration of a digital audio decoder in accordance with the first embodiment of the invention. Herein, reference numerals 30-1, 30-2, 30-3 . . . designate sound sources that operate based on the MPEG/Audio standard with respect to different channels. Namely, the sound source 30-1 is provided for channel 1 (CH1), the sound source 30-2 is provided for channel 2 (CH2), and the sound source 30-3 is provided for channel 3 (CH3), wherein all of them produce and output bit stream data with respect to CH1–CH3 respectively. Reference numerals 31-1, 31-2, 31-3, . . . designate inverse quantization circuits that perform inverse quantization on the bit stream data output from the sound sources 30-1, 30-2, 30-3, . . . respectively. That is, each of the inverse quantization circuits 31-1 to 31-3 reads thirty-two sub-band samples from the bit stream data in accordance with bit allocation information, so that the sub-band samples are subjected to inverse quantization and are multiplied by scale factors. For simplification of the block diagram, FIG. 1 excludes bit allocation information and scale factor extraction blocks (see FIG. 6), which are respectively coupled to the inverse quantization circuits 31-1, 31-2, 31-3, . . .

Each of the inverse quantization circuits 31-1, 31-2, 31-3, . . . outputs inversely quantized data of thirty-two sub-band samples, which are respectively forwarded to thirty-two adders 34-1 to 34-32 via multipliers 33 for use in gain control. Namely, each of them provides thirty-two sub-band samples having serial numbers '1' to '32'. So, the inverse quantization circuits 31-1, 31-2, 31-3, . . . respectively output inversely quantized data of the sub-band sample 1, all of which are added together by the adder 34-1. In addition, they respectively output inversely quantized data of the sub-band sample 2, all of which are added together by the adder 34-2. Similarly, they respectively output inversely quantized data of the sub-band sample 32, all of which are added together by the adder 34-32. With respect to the channels (e.g., CH1–CH3), the adders 34-1 to 34-32 provide addition results of the inversely quantized data of the sub-band samples 1–32, which are synthesized together to restore original digital audio signals (or PCM musical tone signals) by a sub-band synthesis filter bank 36.

The aforementioned first embodiment describes that the inverse quantization is performed on the bit stream data of multiple channels to produce the inversely quantized data, which are added together with respect to each of the thirty-two sub-bands, then, addition results are synthesized together to form the digital musical tone signals by the sub-band synthesis filter bank 36. That is, the first embodiment needs only a single sub-band synthesis filter bank 36, which normally needs a relatively large storage capacity, to cope with a relatively large number of channels. That is, it is possible to remarkably reduce a total storage capacity and simplify the circuit configuration in the digital audio decoder.

Figure 2:
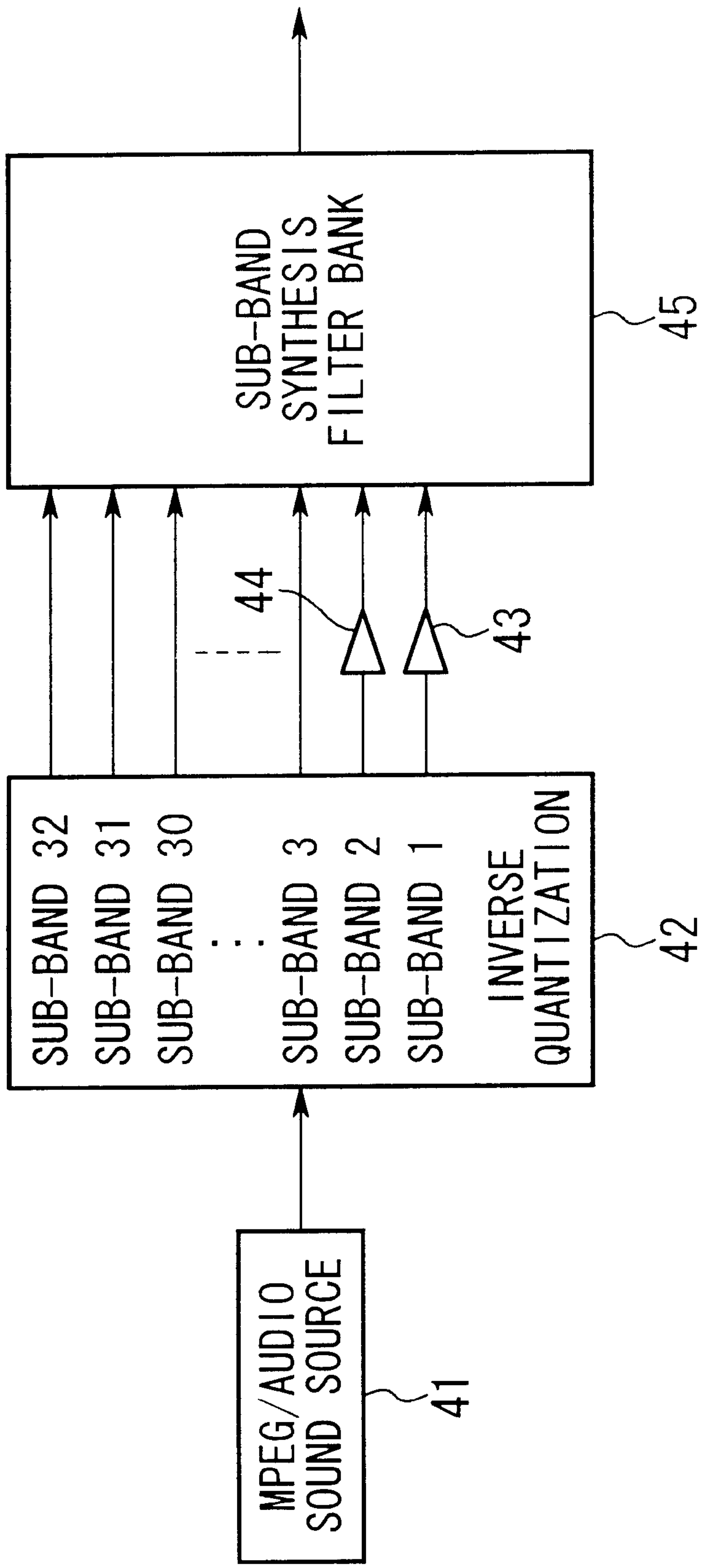
FIG. 2 is a block diagram showing a configuration of a digital audio decoder in accordance with a second embodiment of the invention.

Next, a digital audio decoder of the second embodiment will be described with reference to FIG. 2. Herein, reference numeral 41 designates a sound source that operates based on the MPEG/Audio standard, reference numeral 42 designates an inverse quantization circuit, and reference numeral 45 designates a sub-band synthesis filter bank. Bit stream data output from the sound source 41 are subjected to inverse quantization by the inverse quantization circuit 42 with respect to thirty-two sub-band samples 1–32, wherein the sub-band sample 1 denotes a lowest sub-band for audio data, and the sub-band sample 2 denotes a second lowest sub-band for audio data. Two multipliers 43, 44 are provided subsequent to the inverse quantization circuit 42 with respect to the sub-band samples 1, 2 respectively. That is, the multiplier 43 amplifies inversely quantized data of the sub-band sample 1, while the multiplier 44 amplifies inversely quantized data of the sub-band sample 2. The sub-band synthesis filter bank 45 receives the 'amplified' data from the multipliers 43, 44 with respect to the sub-band samples 1, 2. It also receives other inversely quantized data of the sub-band samples 3–32 from the inverse quantization circuit 42. Based on the aforementioned data, the sub-band synthesis filter bank 45 synthesizes digital audio signals.

The second embodiment does not need a bass boost circuit, which is conventionally provided independently of the decoder. Instead, the second embodiment provides two multipliers 43, 44 for amplification of the lowest sub-band samples, by which it is possible to realize bass boost operation with a simple circuit configuration. Incidentally, the conventional configuration in which the bass boost circuit is provided subsequent to the decoder may not be applied to the multi-channel configuration of the first embodiment shown in FIG. 1 in which sub-band samples of multiple channels are added together before synthesis of the sub-band samples because it is not designed in consideration of adjustment of the bass boost operation for each of the channels. Applying the second embodiment to the multi-channel configuration shown in FIG. 1, it is possible to realize adjustment of bass boost operation with respect to each of the channels.

Figure 3:
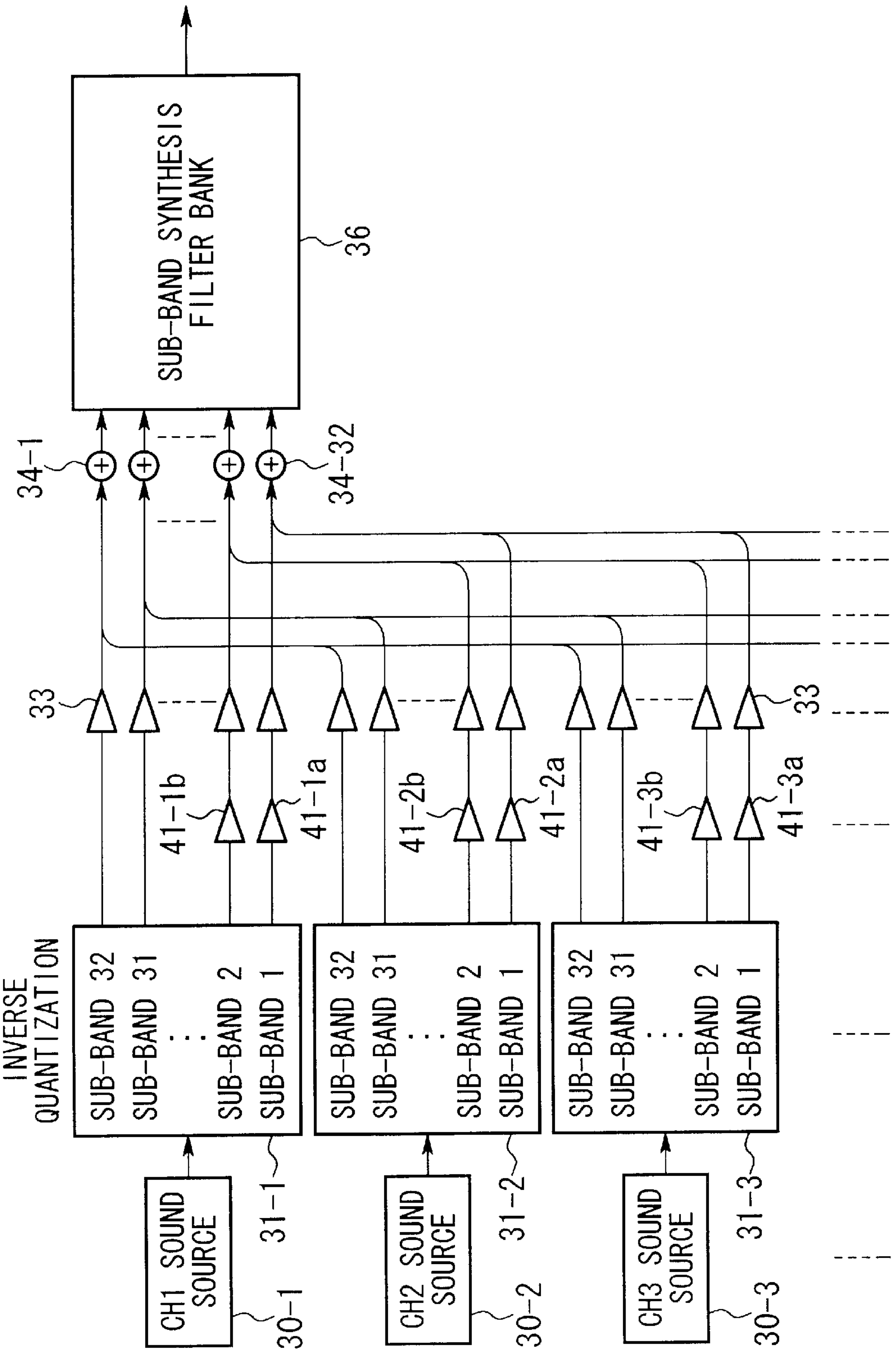
FIG. 3 is a block diagram showing a configuration of a digital audio decoder in accordance with a third embodiment of the invention.

Next, a digital audio decoder of the third embodiment will be described with reference to FIG. 3, which shows a multi-channel configuration as similar to the foregoing first embodiment, wherein parts identical to those shown in FIG. 1 are designated by the same reference numerals, hence, the description thereof will be omitted. As compared with the first embodiment shown in FIG. 1, the third embodiment shown in FIG. 3 is characterized by additionally providing multipliers 41-1*a*, 41-1*b*, 41-2*a*, 41-2*b*, 41-3*a*, 41-3*b*, . . . between the inverse quantization circuits 31-1, 31-2, 31-3, . . . and the multipliers 33. The multipliers are provided for use in gain adjustment of inversely quantized data with respect to lowest sub-band samples 1, 2 respectively. Namely, the multipliers 41-1*a*, 41-1*b* amplify the inversely quantized data of the sub-band samples 1, 2 output from the inverse quantization circuit 31-1, the multipliers 41-2*a*, 41-2*b* amplify the inversely quantized data of the sub-band samples 1, 2 output from the inverse quantization circuit 31-2, and the multipliers 41-3*a*, 41-3*b* amplify the inversely quantized data of the sub-band samples 1, 2 output from the inverse quantization circuit 31-3. Using the aforementioned multipliers, it is possible to perform adjustment of bass boost operations with respect to the multiple channels respectively.

Figure 4:
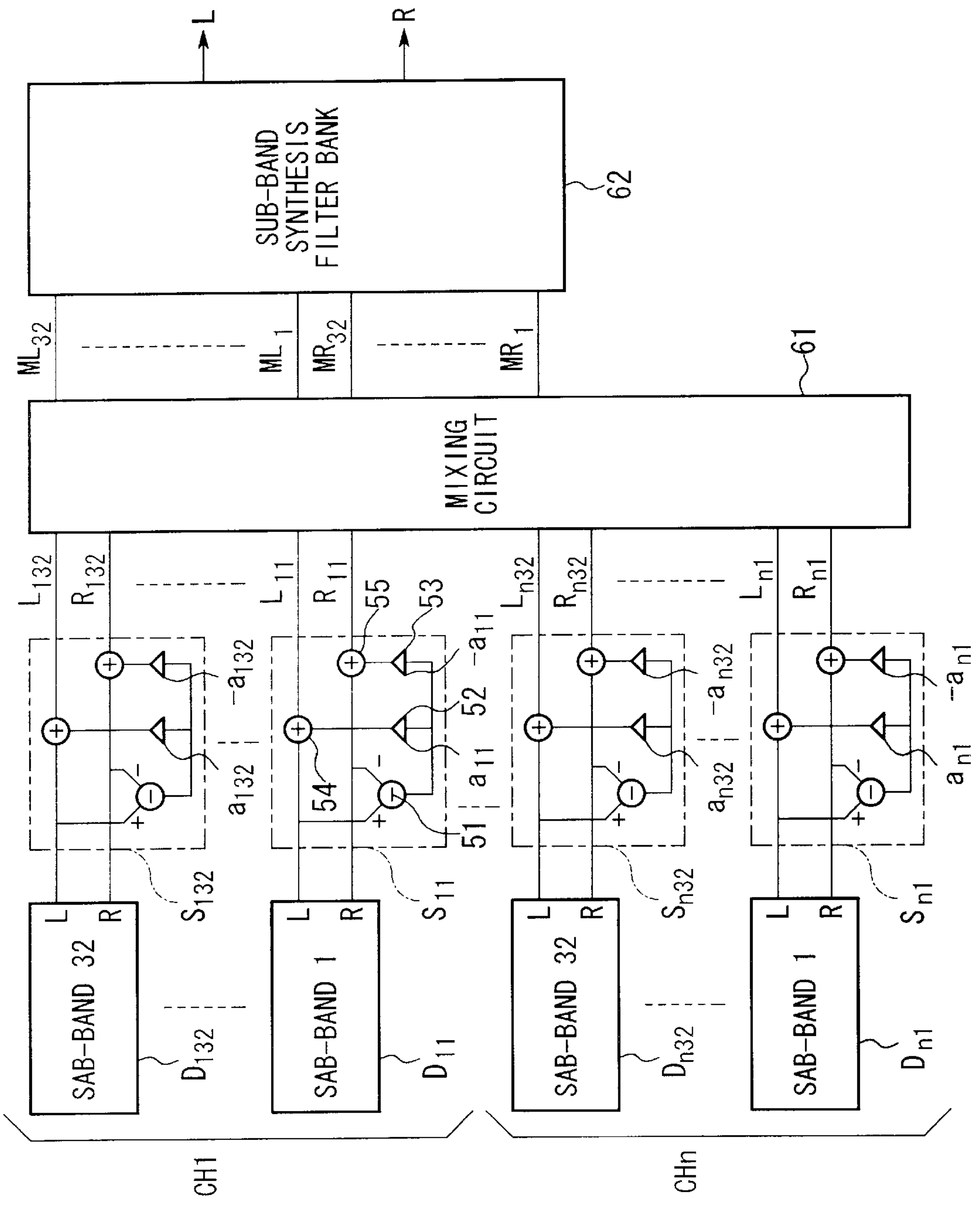
FIG. 4 is a block diagram showing a configuration of a digital audio decoder in accordance with a fourth embodiment of the invention.
Figure 5:
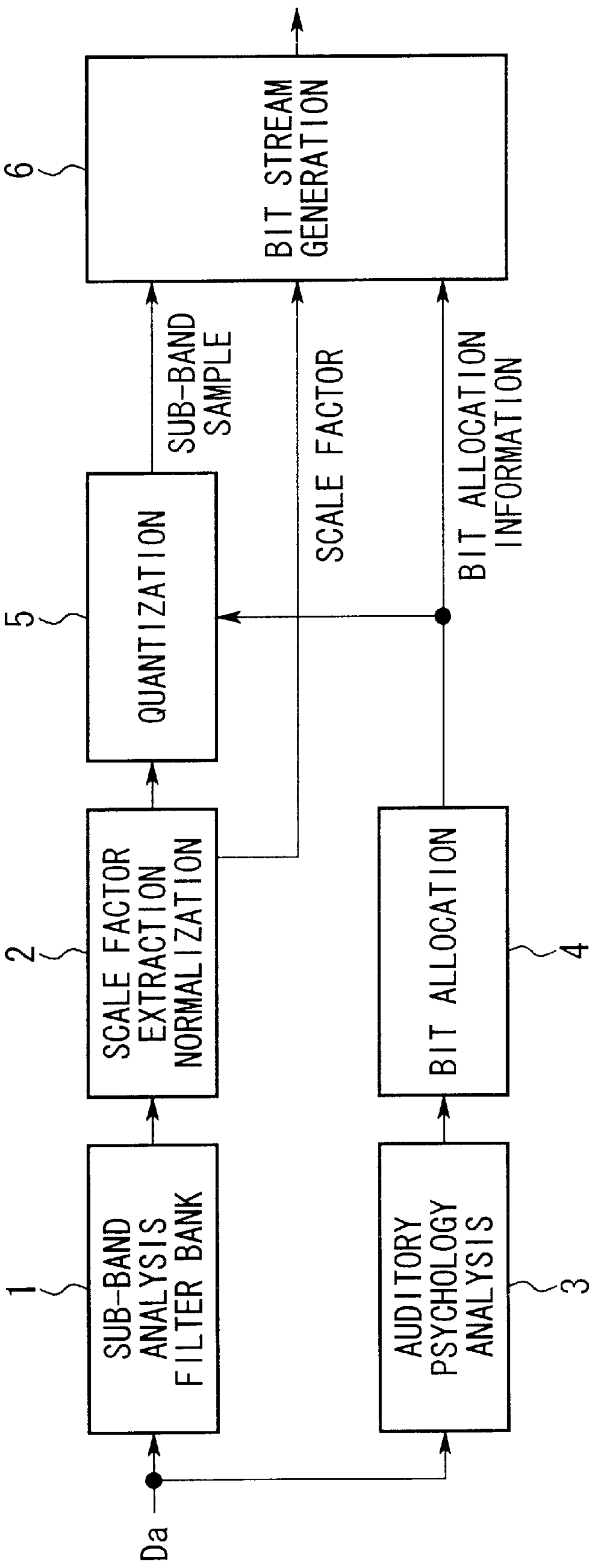
FIG. 5 is a block diagram showing an example of a data compression circuit that operates based on the MPEG/Audio standard.

Next, a digital audio decoder of the fourth embodiment will be described with reference to FIG. 4. The fourth embodiment provides the digital audio decoder that is designed to decode bit stream data of multiple channels, namely CH1 to CHn, each of which contains left-channel components and right-channel components. In addition, it is characterized by that surround effects are independently applied to the left and right channels within the multiple channels CH1–CHn. For convenience' sake, inverse quantization circuits are not illustrated in FIG. 4. That is, reference symbol D11 designates inversely quantized data of the sub-band sample 1 containing left-channel components and right-channel components with respect to the channel CH1. In addition, reference symbol D132 designates inversely quantized data of the sub-band sample 32 containing left-channel components and right-channel components with respect to the channel CH1. Similarly, reference symbol Dn1 designates inversely quantized data of the sub-band sample 1 containing left-channel components and right-channel components with respect to the channel CHn. In addition, reference symbol Dn32 designates inversely quantized data of the sub-band sample 32 containing left-channel components and right-channel components with respect to the channel CHn. Incidentally, the aforementioned two-channel inversely quantized data of the sub-band samples are simply referred to as left-channel and right-channel data of the sub-band samples respectively.

Reference symbol S11 designates a surround effect processing circuit that imparts a surround effect to the left-channel and right-channel data of the sub-band sample 1 with respect to the channel CH1. Herein, a subtracter 51 performs subtraction on the left-channel data and right-channel data of the sub-band sample 1. A multiplier 52 multiplies output of the subtracter 51 by a multiplication coefficient 'a11', while a multiplier 53 multiplies output of the subtracter 51 by a multiplication coefficient '−a11'. An adder 54 adds together output of the multiplier 52 and the left-channel data, while an adder 55 adds together output of the multiplier 53 and the right-channel data. Thus, the surround effect processing circuit S11 outputs surround-effect imparted left-channel data L11 and surround-effect imparted right-channel data R11 for the sub-band sample 1 with respect to the channel CH1. Reference symbol S132 designates a surround effect processing circuit, which is configured similar to the aforementioned surround effect processing circuit S11 and which imparts a surround effect to the left-channel and right-channel data of the sub-band sample 32 with respect to the channel CH1, so that it outputs surround-effect imparted left-channel data L132 and surround-effect imparted right-channel data R132 for the sub-band sample 32 with respect to the channel CH1. Similarly, reference symbol Sn1 designates a surround effect processing circuit that imparts a surround effect to the left-channel and right-channel data of the sub-band sample 1 with respect to the channel CHn, so that it outputs surround-effect imparted left-channel data Ln1 and surround-effect imparted right-channel data Rn1 for the sub-band sample 1 with respect to the channel CHn. Reference symbol Sn32 designates a surround effect processing circuit that imparts a surround effect to the left-channel and right-channel data of the sub-band sample 32 with respect to the channel CHn, so that it outputs surround-effect imparted left-channel data Ln32 and surround-effect imparted right-channel data Rn32 for the sub-band sample 32 with respect to the channel CHn.

Reference numeral 61 designates a mixing circuit that mixes together two-channel outputs of the aforementioned surround effect processing circuits over the channels CH1—CH1 with respect to the sub-band samples respectively. That is, the surround-effect imparted left-channel data L11 to Ln1, which are output from the surround effect processing circuits S11 to Sn1 respectively, are mixed together over the channels CH1–CHn with respect to the sub-band sample 1, so that mixed left-channel data ML1 are produced for the sub-band sample 1. In addition, the surround-effect imparted left-channel data L132 to Ln32, which are output from the surround effect processing circuits S132 to Sn32 respectively, are mixed together over the channels CH1–CHn with respect to the sub-band sample 32, so that mixed left-channel data ML32 are produced for the sub-band sample 32. Similarly, the surround-effect imparted right-channel data R11 to Rn1, which are output from the surround effect processing circuits S11 to Sn1 respectively, are mixed together over the channels CH1–CHn with respect to the sub-band sample 1, so that mixed right-channel data MR1 are produced for the sub-band sample 1. In addition, the surround-effect imparted right-channel data R132 to Rn32, which are output from the surround effect processing circuits S132 to Sn32 respectively, are mixed together over the channels CH1–CHn with respect to the sub-band sample 32, so that mixed right-channel data MR32 are produced for the sub-band sample 32.

Reference numeral 62 designates a sub-band synthesis filter bank that synthesizes the mixed left-channel data ML1 to ML32 to produce left-channel musical tone data (L) and that also synthesizes the mixed right-channel data MR1 to MR32 to produce right-channel musical tone data (R).

Figure 8:
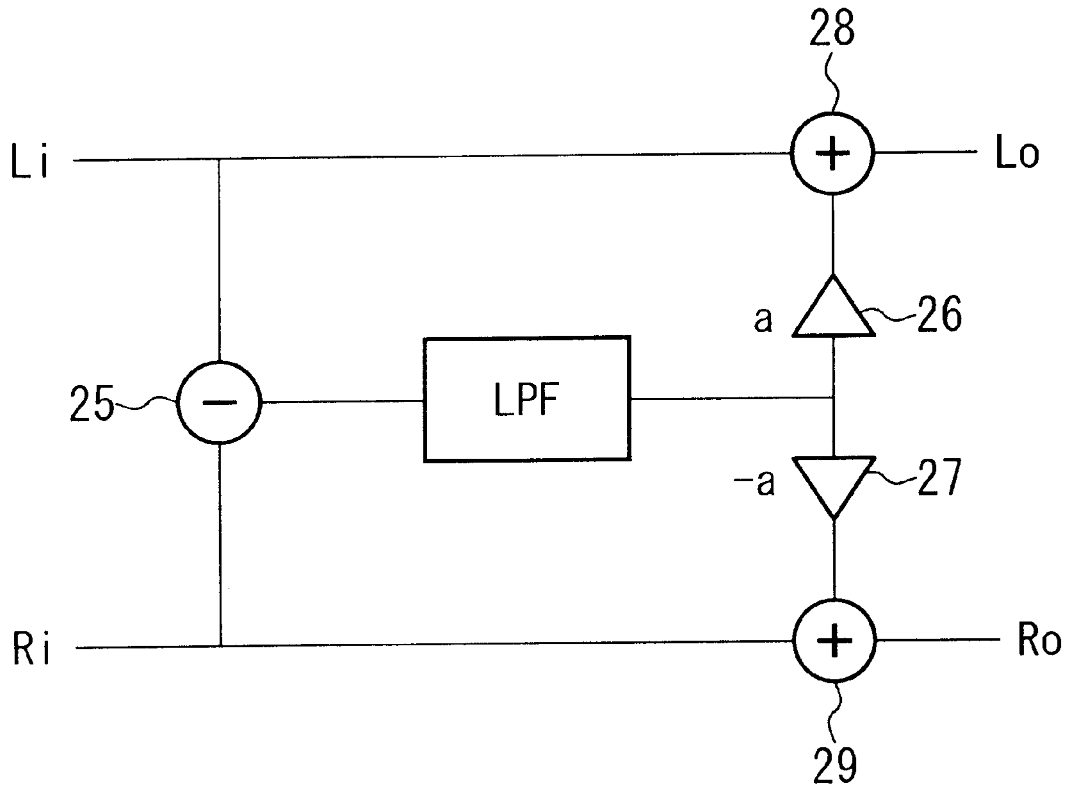
FIG. 8 is a circuit diagram showing a configuration of a surround effect circuit that is conventionally known.

In each of the aforementioned surround effect processing circuits S11–Sn1 and S132–Sn32, it is possible to independently change the multiplication coefficients for the pairs of multipliers (e.g., 52, 53). Thus, it is possible to impart a surround effect having a desired value to each of the multiple channels. Consider that a certain surround effect realized by a low-pass filter having a cutoff frequency 1.5 kHz (see FIG. 8) is applied to the data of the channel CH1, for example. In that case, the multiplication coefficients a11 to a132 are set to prescribed values, as follows:

| | |
|---|---|
| a11 to a13: | 2.0 |
| a14: | 1.0 |
| a15: | 0.5 |
| a16: | 0.25 |
| a132: | 0 |

In the above, the sampling frequency is set to 32 kHz.

To cope with 'monaural' channel within the multiple channels, both of the multiplication coefficients of the multipliers are set to '0' to cancel the surround effect on that channel. Thus, it is possible to directly transmit monaural sound of the prescribed channel without imparting the surround effect.

In addition, it is possible to adequately change the multiplication coefficients of the multipliers in the surround effect processing circuits to actualize desired surround effects. For example, multiplication coefficients for use in the surround effect processing circuits processing low-frequency components of sounds (e.g., sub-band samples 1, 2, etc.) are increased higher, while multiplication coefficients for use in the surround effect processing circuits processing high-frequency components of sounds (e.g., sub-band samples 31, 32, etc.) are decreased lower. Thus, it is possible to impart the prescribed surround effect realizing the low-pass filter or the like to sounds. Incidentally, the configurations of the surround effect processing circuits are not necessarily limited to one shown in FIG. 8.

The foregoing embodiments describe decoding techniques effected on bit stream data, which are created by sub-band coding with regard to thirty-two sub-bands being divided. Herein, the number of the sub-bands being divided is not necessarily limited to thirty two. In addition, the present invention is applicable to other types of bit stream data (based on the MPEG/Audio Layer 3, for example), which are created by MDCT (or modified discrete cosine transform) with respect to thirty-two sub-bands being divided. In other words, the bit stream data are forwarded to the digital audio decoder of the present invention after the prescribed pre-processing such as IDLT, for example.

As described heretofore, this invention has a variety of effects and technical features, which will be described below.

(1) In a first aspect of the invention, there is provided a digital audio decoder that comprises inverse quantization circuits for multiple channels respectively, combining means and a sub-band synthesis filter bank. Herein, the inverse quantization circuits perform inverse quantization on bit stream data of the multiple channels with respect to a prescribed number of sub-band samples respectively, so that inversely quantized data are produced with respect to the sub-band samples respectively. The inversely quantized data of the same sub-band sample are combined together among the multiple channels. Then, they are synthesized together to reproduce original digital audio signals by the sub-band synthesis filter bank. Although the aforementioned digital audio decoder operates as an expansion circuit for expanding 'compressed' bit stream data of the multiple channels, it needs only a single sub-band synthesis filter bank, which has a relatively large storage capacity. As compared with the conventional decoders using plural filter banks, it is possible to remarkably reduce the total storage capacity provided for the digital audio decoder. In addition, it is possible to simplify the overall circuit configuration of the digital audio decoder. If the digital audio decoder is manufactured as a chip fabricating semiconductor integrated circuits, it is possible to reduce the size of the chip and it is possible to reduce the cost for manufacturing the digital audio decoder.

(2) In a second aspect of the invention, there is provided a digital audio decoder that comprises an inverse quantization circuit, amplification means and a sub-band synthesis filter bank. Herein, the inverse quantization circuit performs inverse quantization on bit stream data, so that inversely quantized data are produced with respect to a prescribed number of sub-band samples respectively. Amplification is performed selectively on the inversely quantized data of the lowest sub-band samples corresponding to low-frequency components of sound. Then, other inversely quantized data corresponding to high-frequency components of sound are synthesized together with the 'amplified' data corresponding to the low-frequency components by the sub-band synthesis filter bank, which reproduces the original digital audio signals. This enables the bass boost process to be easily implemented in the decoder. As compared with the conventional circuit configuration in which bass boost circuits are provided externally of the decoder, it is possible to simplify the circuit configuration of the digital audio decoder.

(3) In a third aspect of the invention, there is provided a digital audio decoder that comprises inverse quantization circuits for bit stream data of multiple channels respectively, combining means, amplification means and a sub-band synthesis filter bank. Herein, the inverse quantization circuits perform inverse quantization on the bit stream data of the multiple channels, so that inversely quantized data are produced with respect to a prescribed number of sub-band samples respectively. Amplification is performed selectively on the inversely quantized data of the lowest sub-band samples corresponding to low-frequency components of sound. The amplified data of the same sub-band sample are combined together among the multiple channels. In addition, the inversely quantized data of the same sub-band sample are also combined together among the multiple channels. Then, all of them are synthesized together by the sub-band synthesis filter bank. Thus, it is possible to manufacture a digital audio decoder, which enables bass boost operations for the multiple channels of the bit stream data, with a relatively small storage capacity and with a simple circuit configuration.

(4) In a fourth aspect of the invention, the digital audio decoder is designed to cope with bit stream data of multiple channels each containing left and right channels. That is, there are provided inversely quantized data (namely, left-channel and right-channel data) for thirty-two sub-band samples with respect to the multiple channels respectively. Surround effect processing circuits impart surround effects to the left-channel and right-channel data with respect to the sub-band samples and multiple channels respectively. Surround-effect imparted left-channel data are mixed together to form mixed left-channel data over the multiple channels with respect to the sub-band samples respectively. In addition, surround-effect imparted right-channel data are mixed together to form mixed right-channel data over the multiple channels with respect to the sub-band samples respectively. A sub-band synthesis filter bank synthesizes the mixed left-channel data over the sub-band samples, and it also synthesizes the mixed right-channel data over the sub-band samples. In the surround effect processing circuits, it is possible to perform fine adjustment and fine setup for multiplication coefficients realizing the surround effects with respect to the sub-band samples and multiple channels respectively. Thus, it is possible to provide desired surround effects whose values are being adequately controlled on the multiple channels respectively.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. A digital audio decoder comprising:

a plurality of inverse quantization circuits for performing inverse quantization on a plurality of bit stream data, which are supplied thereto in connection with a plurality of channels respectively, thus producing inversely quantized data with respect to a prescribed number of sub-band samples respectively;

amplification means for amplifying inversely quantized data of selected sub-band samples, which are respectively output from the plurality of inverse quantization circuits in response to low-frequency components of sound;

combining means for combining together the inversely quantized data of the sub-band samples excluding the selected sub-band samples among the plurality of channels and for combining together amplified data corresponding to the selected sub-band samples among the plurality of channels; and a filter bank for synthesizing together combined data of the combining means corresponding to all of the sub-band samples, thus reproducing original digital audio signals.

2. A digital audio decoder according to claim 1, wherein the amplification means correspond to multipliers that increase magnitudes of the inversely quantized data of the selected sub-band samples.

3. A digital audio decoder according to claim 1 wherein the combining means correspond to a plurality of adders each of which adds together the inversely quantized data or the amplified data among the plurality of channels with respect to a same sub-band sample within the prescribed number of sub-band samples.

4. A digital audio decoder according to claim 3 wherein the combining means further comprises multipliers for gain control with respect to the inversely quantized data of the sub-band samples.

5. A digital audio decoder according to claim 1 wherein the bit stream data are compressed based on an MPEG/Audio standard.

6. A digital audio decoder according to claim 1 wherein the inverse quantization is performed on thirty-two sub-band samples respectively.

7. A digital audio decoder comprising:

a plurality of inverse quantization circuits for performing inverse quantization on a plurality of bit stream data with respect to a plurality of channels respectively, thus producing inversely quantized data containing left-channel data and right-channel data with respect to a prescribed number of sub-band samples respectively;

a plurality of surround effect processing circuits for imparting surround effects to the left-channel data and right-channel data of the inversely quantized data with respect to the sub-band samples respectively, thus producing surround-effect imparted left-channel data and surround-effect imparted right-channel data;

a mixing circuit for mixing together the surround-effect imparted left-channel data over the plurality of channels, thus producing mixed left-channel data with respect to the sub-band samples respectively, said mixing circuit also mixing together the surround-effect imparted right-channel data over the plurality of channels, thus producing mixed right-channel data with respect to the sub-band samples respectively; and a filter bank for synthesizing together the mixed left-channel data over the sub-band samples to provide a left-channel output and for synthesizing together the mixed right-channel data over the sub-band samples to provide a right-channel output.

8. A digital audio decoder according to claim 7, wherein each of the surround effect processing circuits contains a subtracter for producing difference signals between the left-channel data and right-channel data, a first multiplier for multiplying the difference signals by a positive coefficient, a second multiplier for multiplying the difference signals by a negative coefficient, a first adder for adding an output of the first multiplier to the left-channel data, and a second adder for adding an output of the second multiplier to the right-channel data.

9. A digital audio decoder according to claim 7 wherein the bit stream data are compressed based on an MPEG/Audio standard.

10. A digital audio decoder according to claim 7 wherein the inverse quantization is performed on thirty-two sub-band samples respectively.

* * * * *